United States Patent [19]
Grubelic et al.

[11] Patent Number: 5,211,756
[45] Date of Patent: May 18, 1993

[54] APPARATUS TO MANUFACTURE PRINTED CIRCUIT BOARDS

[75] Inventors: Ivo Grubelic, Clearwater; Vladimir Velitschkowski, St. Petersburg, both of Fla.

[73] Assignee: Micro-Plate/Systems, Clearwater, Fla.

[21] Appl. No.: 743,102

[22] Filed: Aug. 9, 1991

[51] Int. Cl.$^5$ .............................................. B05C 1/02
[52] U.S. Cl. .................................... 118/316; 118/324
[58] Field of Search ............................... 118/316, 324

[56] References Cited

U.S. PATENT DOCUMENTS 4,611,554 9/1986 Mahlkow et al. ................ 118/316
5,113,785 5/1992 Martin ................................ 118/58

FOREIGN PATENT DOCUMENTS 2439734 10/1978 France .

Primary Examiner—W. Gary Jones
Assistant Examiner—Charles K. Friedman
Attorney, Agent, or Firm—A. W. Fisher, III

[57] ABSTRACT

An apparatus to manufacture or produce articles such as printed circuit boards comprising at least one module having an entry and exit opening formed on opposite ends thereof and a transport mechanism comprising a continuous conveyor including a plurality of interconnected conveyor links to support the articles thereon and an entry and exit roller seal assembly each including a pair of rotatable seal rollers disposed to seal the entry and exit openings respectively and engage the articles passing through the entry and exit openings respectively, an article guide to maintain the articles in a substantially vertical position as the articles transverse the apparatus and a fluid supply to expose both sides of the article uniformly with fluid.

39 Claims, 7 Drawing Sheets

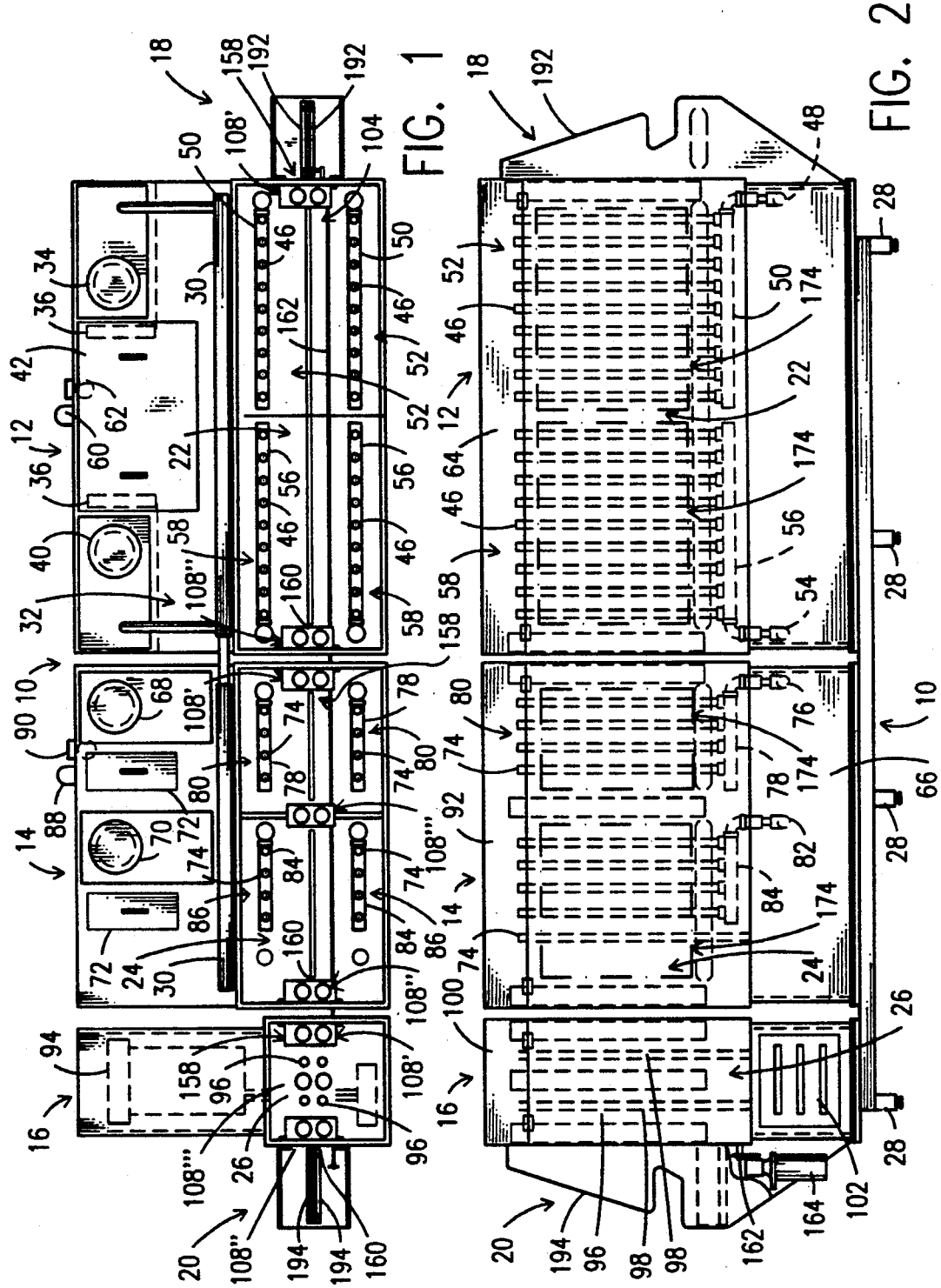

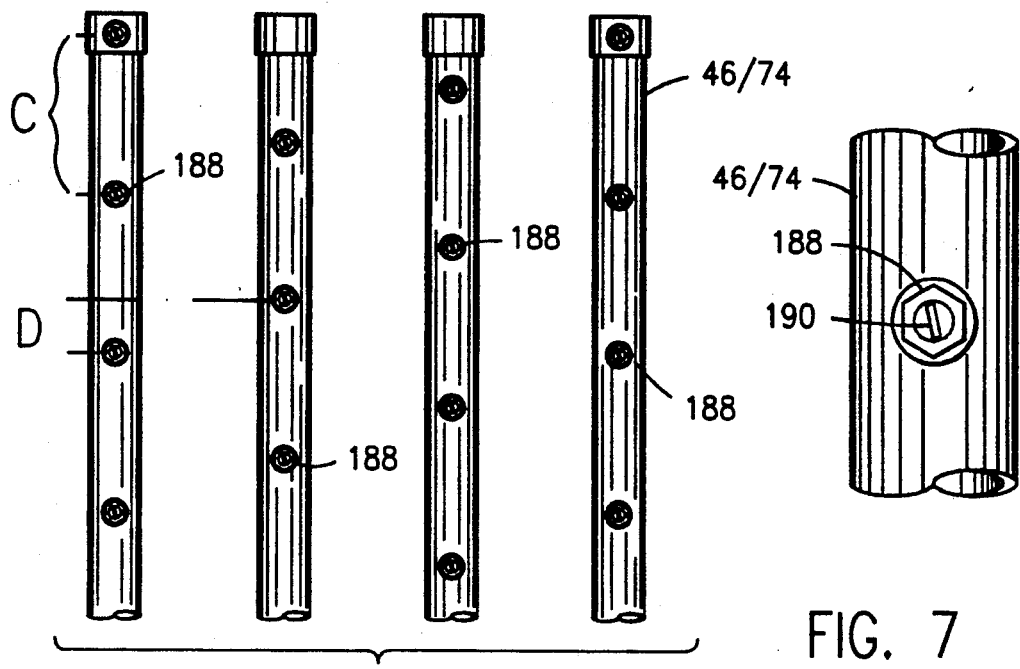
FIG. 6
FIG. 7
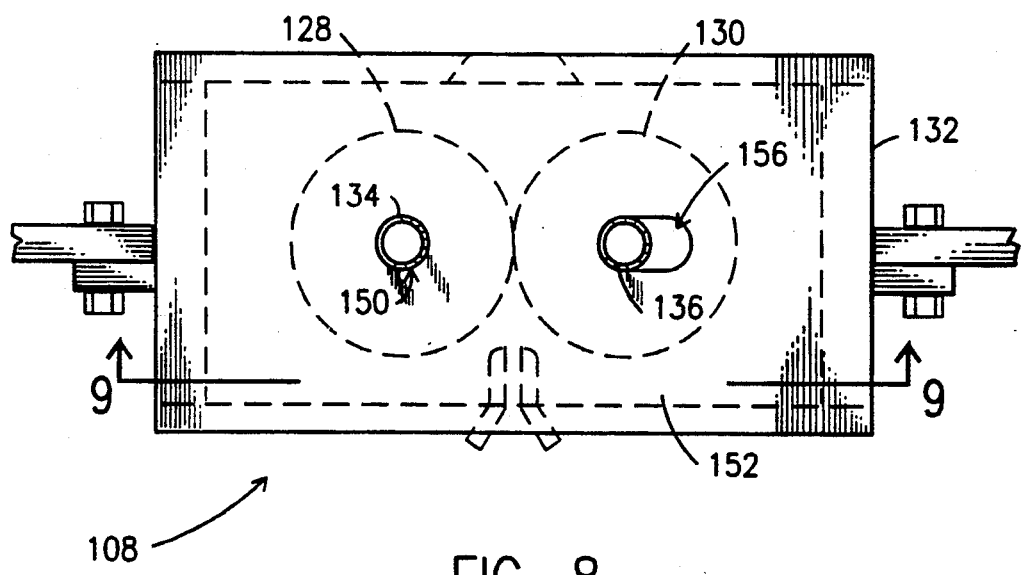
FIG. 8

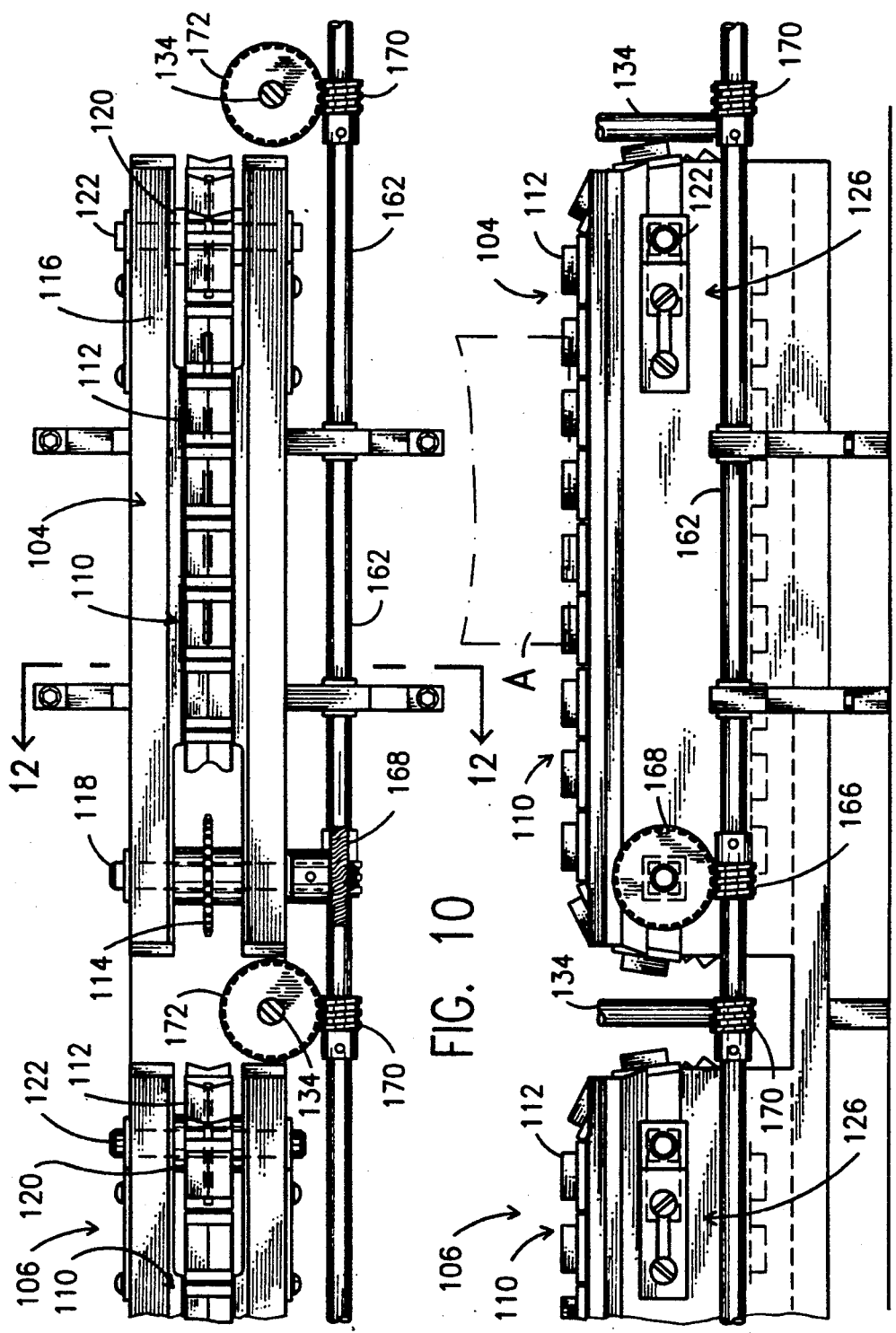

APPARATUS TO MANUFACTURE PRINTED CIRCUIT BOARDS

BACKGROUND OF THE INVENTION

1. Field of the Invention

An apparatus for producing articles such as printed circuit boards.

2. Description of the Prior Art

Printed circuit boards are normally formed of a relatively inert material such as fiberglass reinforced board cladding on both sides thereof. A photoresist is then applied to one or both sides of the board. The photoresist is essentially inert to the plating processes that, after being exposed to a circuit pattern and developed, defines a pattern in developed voids of the photoresist. The boards may be electrically charged and placed in a solution including a metal to be deposited. After the metal is deposited the boards are rinsed.

The photoresist is removed and the cladded layer is etched off the board, leaving the circuit plated on the board.

U.S. Pat. No. 4,620,894 relates to a method and apparatus for etching and otherwise chemically treating electronic printed circuit board substrates comprising a hollow tubing to engage and transport the circuit board substrates.

U.S. Pat. No. 4,611,554 discloses a device and method for the treating of vertically disposed printed circuit boards comprising a transport conveyor above an accumulating reservoir and below spraying nozzles applying a process solution to the side surfaces of each printed circuit board.

U.S. Pat. No. 4,620,894 shows a method and apparatus for chemically treating vertically disposed circuit board substrates comprising a conveyor system for transporting the vertically disposed circuit board substrates through a plurality of adjacent spray chambers employing hollow slack tubing to engage and transport the substrates.

U.S. Pat. No. 4,401,522 relates to a continuous metal exchange for workpieces such as a printed circuit board comprising a continuous horizontal transport and plating tank. Opposite ends of the plating tank include slots to receive and discharge the workpieces sealed by opposed rollers. The workpieces are held by a non-conductive hanger coupled to the upper portion thereof.

U.S. Pat. No. 4,427,019 discloses a continuous processing of flat workpieces such as printed circuit boards suspended by a hanger on a conveyor for continuous horizontal transport. The conveyor transports the workpieces through a plurality of chambers having slotted-end members.

U.S. Pat. No. 3,910,406 relates to a two-part clip each including a base and leg having a socket for receiving the outer end of a connecting pin of an articulated roller chain conveyor. A support surface is formed from a rod extending outwardly from the two-part clip. The two-part clip may include a drive engaging member to permit an articulated roller chain carrying the two-part clip to be driven by a drive mechanism.

U.S. Pat. No. 4,530,433 discloses a pincer comprising a plate having lateral openings on one side thereof and a center opening on the other side thereof coupled to adjacent plates to form a conveyor chain for bottles gripped by a pair of jaws. The pincer cooperates with a half-collar fitting the outline of the neck of a bottle being processed.

SUMMARY OF THE INVENTION

The present invention relates to an apparatus to manufacture or produce articles such as printed circuit boards comprising a process module, rinse module and dry module having a load and unload station disposed on opposite ends thereof. The process module, rinse module and dryer module 16 are disposed in end-to-end relationship relative to each other to cooperatively form a processing chamber, rinsing chamber and drying chamber.

The process module supplies processing fluid to articles through a processing fluid circulating system and a plurality of fluid spray tubes as articles traverse through the processing chamber.

The rinse module supplies rinse to articles through a rinse fluid circulating system and plurality of fluid rinse tubes as articles traverse through the rinse chamber.

The dry module comprises a dry blower and dry tubes disposed on opposites sides of the dry chamber to dry articles during traverse through the dry chamber.

The transport mechanism comprises a drive means, a conveyor means including a process conveyor section and a rinse conveyor section, and a plurality of roller seal assemblies.

The process and rinse conveyor sections each comprises a continuous conveyor including a plurality of interconnected conveyor links extending between a conveyor drive sprocket and a conveyor idler sprocket disposed at the opposite end of the process and rinse modules. A recess is formed on each interconnected conveyor link to partially receive articles therein.

Each roller seal assembly comprises a first and second substantially vertical parallel seal roller. Each roller seal assembly includes a primary and secondary roller drive means. The second substantially vertically parallel seal roller is movable laterally to accommodate passage of articles between the first and second substantially vertical parallel seal rollers.

The drive means comprises a primary drive shaft coupled to a drive motor operatively coupled to each continuous conveyors and each roller seal assembly. In this configuration the movement and speed of the continuous conveyors and roller seal assemblies are synchronized.

The article guide comprises a plurality of article guide sections disposed in both the processing chamber and rinse chamber on opposite sides of the continuous conveyors to provide continuous support of articles transversing the processing chamber and rinse chamber.

In operation, articles are introduced into the apparatus through a load station and entry opening of the process module on the conveyor. Articles are transported through the processing chamber by the corresponding roller seal assembly and conveyor section exposing articles to a processing fluid from fluid spray tubes. Articles are then transported through the rinse chamber by the corresponding roller seal assemblies and conveyor section exposing articles to rinse fluid from fluid rinse tubes. Articles are finally transported through the drying chamber by the corresponding roller seal assemblies exposing articles to air from the drying tubes. Articles are discharged through an unload station.

The invention accordingly comprises the features of construction, combination of elements and arrangement of parts which will be exemplified in the construction hereinafter set forth, and the scope of the invention will be indicated in the claims.

BRIEF DESCRIPTION OF THE DRAWINGS

For a fuller understanding of the nature and object of the invention, reference should be had to the following detailed description taken in connection with the accompanying drawings in which:

FIG. 1 is a top view of the apparatus for producing articles.

FIG. 2 is a side view of the apparatus for producing articles.

FIG. 6 is a partial elevation view of the spray means.

FIG. 8 is a top view of the roller seal assembly.

FIG. 10 is a partial top view of the transport mechanism.

FIG. 11 is a partial side view of the transport mechanism.

Similar reference characters refer to similar parts throughout the several views of the drawings.

DETAILED DESCRIPTION OF THE PREFERRED EMBODIMENT

The present invention relates to an apparatus to manufacture or produce articles such as printed circuit boards.

Figure 3:
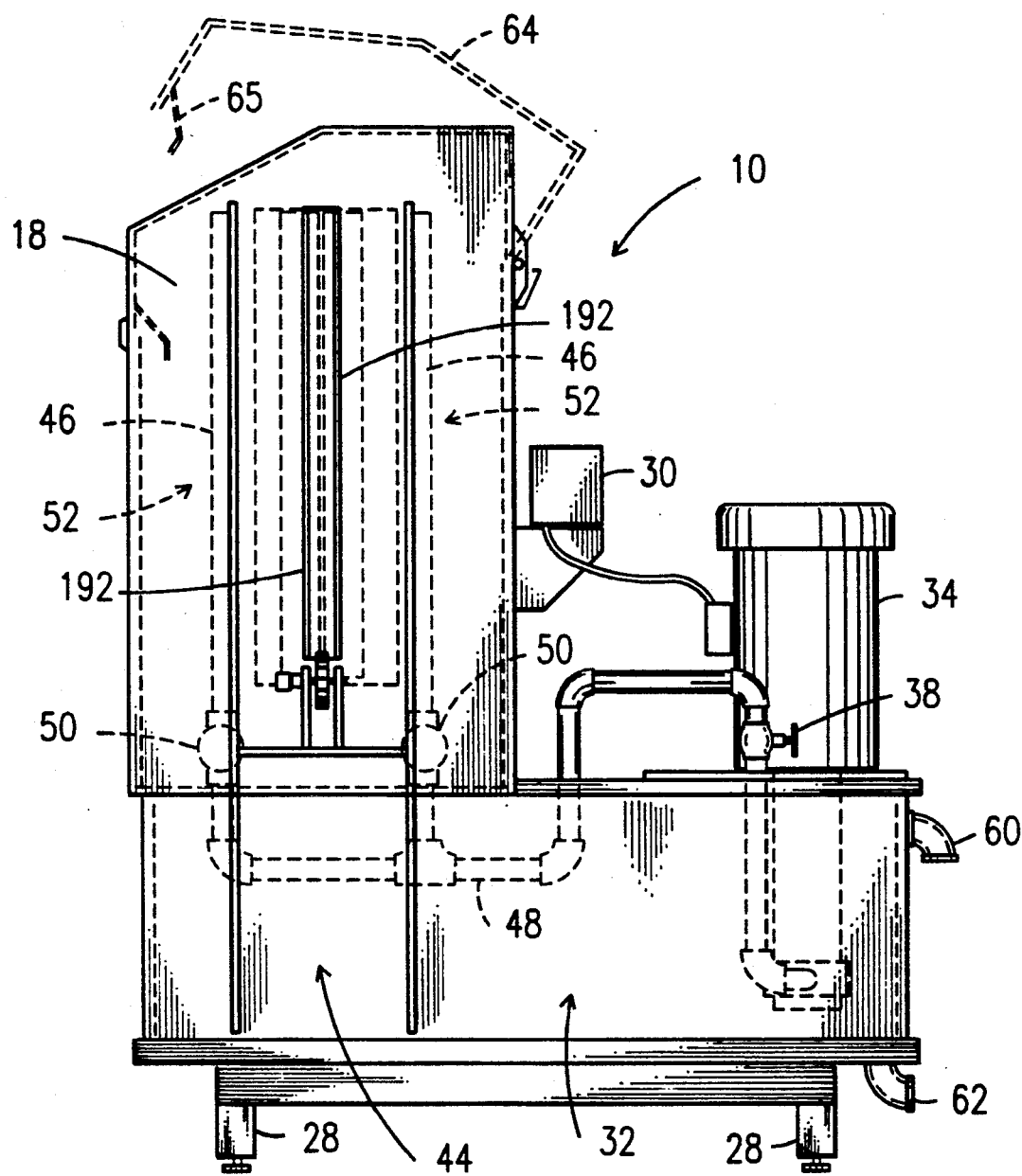
FIG. 3 is an end view of the apparatus for producing articles.

As shown in FIGS. 1 through 3, the apparatus generally indicated as 10 comprises a process module, rinse module and dry module generally indicated as 12, 14 and 16 respectively having a load and unload station generally indicated as 18 and 20 respectively disposed on opposite ends thereof. The process module 12, rinse module 14 and dry module 16 are disposed in end-to-end relationship relative to each other to cooperatively form a processing chamber, rinsing chamber and drying chamber indicated as 22, 24 and 26 respectively. The apparatus 10 is supported by a plurality of supports each indicated as 28. As shown in FIGS. 1 and 3, an electrical conduit 30 extends longitudinally along the rear of the apparatus 10 to house electrical wiring to provide a source of electrical power in conventional fashion to the various electrically driven components described more fully hereinafter.

As shown in FIGS. 1 and 3, the process module 12 comprises a reservoir, first pump, filter(s), control valve(s), second pump and access cover indicated as 32, 34, 36, 38, 40 and 42 respectively to operatively supply processing fluid to articles A through a processing fluid circulating system generally indicated as 44 and a plurality of fluid spray tubes each indicated as 46 as articles A traverse through the processing chamber 22.

As best shown in FIGS. 1 through 3, the processing fluid circulating system 44 comprises a first fluid supply conduit 48 coupled between the first pump 34 and a first spray manifold including a pair of first spray manifold conduits each indicated as 50 disposed on opposite sides of the processing chamber 22 coupled to a corresponding bank of fluid spray tubes 46 each generally indicated as 52 and a second fluid supply conduit 54 coupled between the second pump 40 and a second spray manifold including a pair of second spray manifold conduits each indicated as 56 disposed on opposite sides of the processing chamber 22 coupled to a corresponding bank of fluid spray tubes 46 each generally indicated as 58. An overflow conduit 60 and drain conduit 62 are formed on the wall of the reservoir 32. A clear transparent lid or cover 64 with a latch 65 is hingedly coupled to the process module 12 to permit visual observation within the processing chamber 22 and selective access thereto.

As shown in FIGS. 1 and 2, the rinse module 14 comprises a reservoir, first and second pumps and access cover(s) indicated as 66, 68, 70 and 72 respectively to operatively supply rinse to articles A through a rinse fluid circulating system and plurality of fluid rinse tubes each indicated as 74 as articles A traverse through the rinse chamber 24.

As best shown in FIGS. 1 and 2, the rinse fluid circulating system comprises a first rinse supply conduit 76 coupled between the first pump 68 and a first rinse manifold including a pair of first rinse manifold conduits each indicated as 78 disposed on opposite sides of the rinse chamber 24 coupled to a corresponding bank of fluid rinse tubes 74 each generally indicated as 80 and a second fluid rinse conduit 82 coupled between the second pump 70 and a second rinse manifold including a pair of second rinse manifold conduits each indicated as 84 disposed on opposite sides of the rinse chamber 24 coupled to a corresponding bank of fluid rinse tubes 74 each generally indicated as 86. An overflow conduit 88 and drain conduit 90 are formed on the wall of the reservoir 66. A clear transparent lid or cover 92 with a latch similar to latch 65 is hingedly coupled to the rinse module 14 to permit visual observation within the rinse chamber 24 and selective access thereto.

Although a single rinse module 14 is shown, it is envisioned that a series of rinse modules 14 may be combined to permit reduction of water usage through overflow water cascading.

As shown in FIGS. 1 and 2, the dry module 16 comprises at least one dry blower indicated as 94 operatively coupled to at least one pair of dry tubes each indicated as 96 disposed on opposites sides of the dry chamber 26 to dry articles A during traverse through the dry chamber 26. Each dry tube 96 includes a plurality of apertures each indicated as 98 formed therein. A clear transparent lid or cover 100 with a latch similar to latch 65 is hingedly coupled to the dry module 16 to permit visual observation within the dry chamber 26 and selective access thereto. An air intake vent 102 is formed on the lower portion of the dry chamber 26.

The transport mechanism is best shown in FIGS. 1, 2 and 8 through 12. Specifically, the transport mechanism comprises a drive means, a conveyor means including a process conveyor section generally indicated as 104 and a rinse conveyor section generally indicated as 106 and a plurality of roller seal assemblies each indicated as 108.

Figure 12:
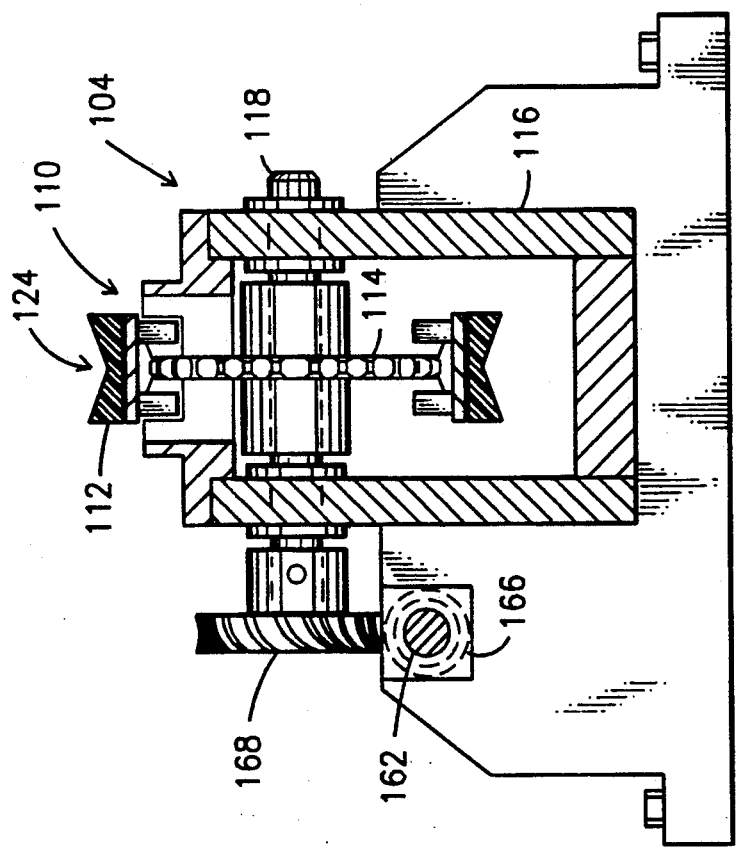
FIG. 12 is a cross-sectional view of the transport mechanism taken along line 12—12 of FIG. 10.

As best shown in FIGS. 10 through 12, the process and rinse conveyor sections 104 and 106 each comprises a continuous conveyor generally indicated as 110 including a plurality of interconnected conveyor links each indicated as 112 extending between a conveyor drive sprocket 114 rotatably mounted to a frame 116 by a shaft 118 and a conveyor idler sprocket 120 rotatably mounted to the frame 116 by a shaft 122 disposed at the opposite end of the process and rinse module 12 and 14. A recess 124 is formed on each interconnected conveyor link 112 to partially receive articles A therein. The conveyor drive sprockets 114 and corresponding conveyor idler sprockets 120 are disposed to engage the corresponding continuous conveyor 110. A conveyor adjustment means generally indicated as 126 permits longitudinal adjustment of the conveyor idler sprocket 120 relative to the corresponding conveyor drive sprocket 114.

Figure 9:
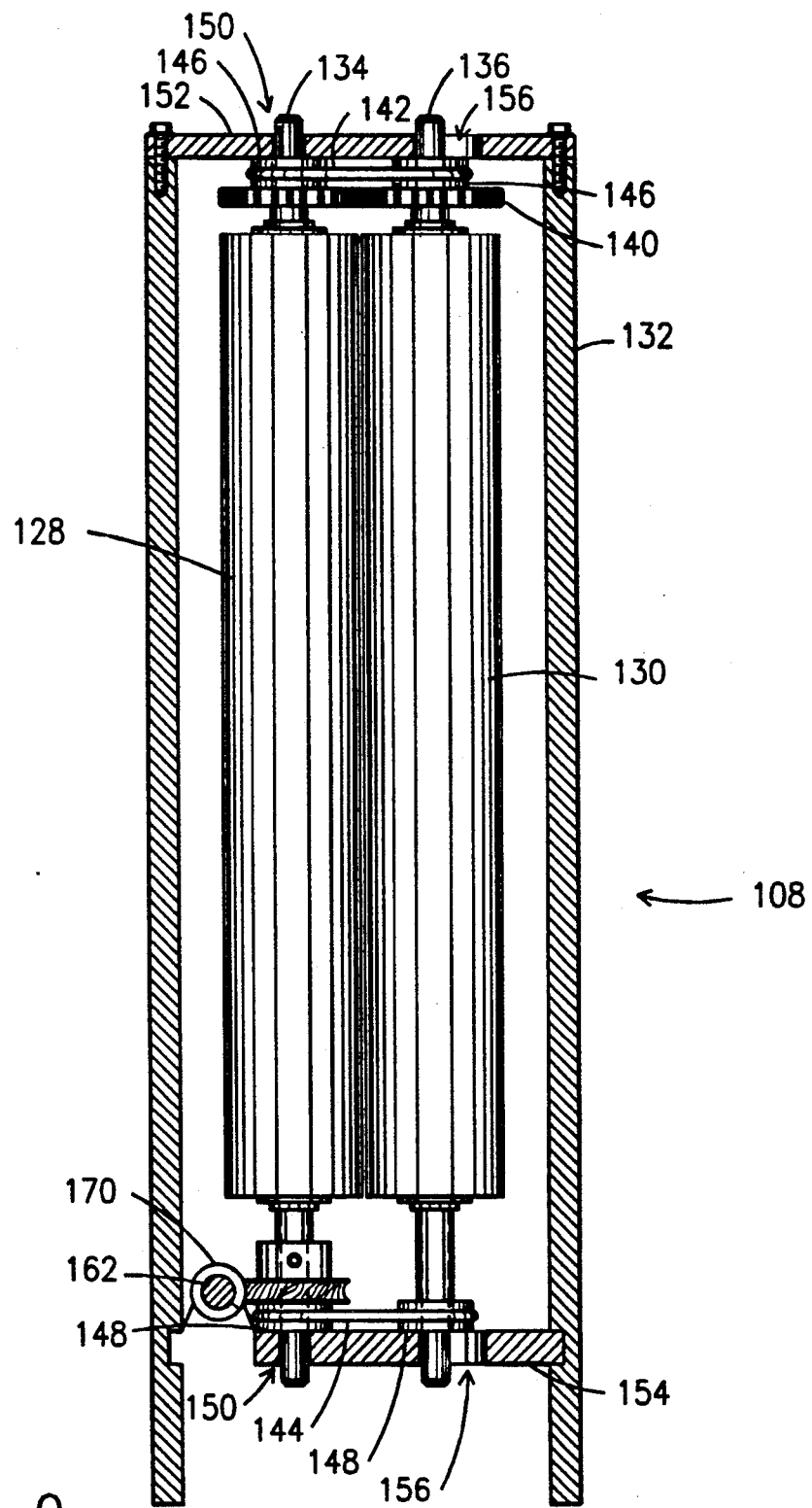
FIG. 9 is an elevation view of the roller seal assembly taken along line 9—9 of FIG. 8.

As best shown in FIGS. 8 and 9, each roller seal assembly 108 comprises a first and second substantially vertical parallel seal roller indicated as 128 and 130 respectively operatively coupled to a frame 132 by a first and second shaft indicated as 134 and 136 respectively. Each roller seal assembly 108 further includes a roller drive means. The roller drive means comprises a first and second roller drive gear indicated as 138 and 140 respectively mounted on the upper end portions of the first and second shaft 134 and 136 respectively. A roller tension means comprising an upper and lower roller resilient bias indicated as 142 and 144 respectively are coupled between a pair of upper and lower roller pulleys indicated as 146 and 148 respectively to normally hold the first and second substantially vertical parallel seal rollers 128 and 130 together in sealing engagement. As shown, the first shaft 134 extends through circular apertures each indicated as 150 formed through upper and lower frame members indicated as 152 and 154 respectively of the frame 132; while, the second shaft 136 extends through an upper and lower oblong aperture or slot each indicated as 156 formed through the upper and lower frame member 152 and 154 to permit lateral movement of the second substantially vertically parallel seal roller 130 to accommodate passage of articles A between the first and second substantially vertical parallel seal rollers 128 and 130.

As best shown in FIGS. 1 and 2, an entrance roller seal assembly 108' and an exit seal roller assembly 108" are disposed adjacent entry and exit openings indicated as 158 and 160 respectively formed at opposite ends of the processing chamber 22, rinse chamber 24 and dry chamber 26. In addition, an intermediate seal roller assembly 108''' is disposed in the mid-portion of both the rinse chamber 24 and dry chamber 26.

As shown in FIGS. 2 and 9 through 12, the drive means comprises a primary drive shaft 162 coupled to a drive motor 164. As best shown in FIGS. 10 through 12, the primary drive shaft 162 is operatively coupled to each continuous conveyor 110 by a first conveyor gear 166 affixed to the primary drive shaft 162 and a second conveyor gear 168 affixed to the shaft 118. The primary drive shaft 162 is operatively coupled to each roller seal assembly 108 by a first roller gear 170 affixed to the primary drive shaft 162 and a second roller gear 172 affixed to the shaft 134. In this configuration the movement and speed of the continuous conveyors 110 and roller seal assemblies 108 are synchronized.

Figure 4:
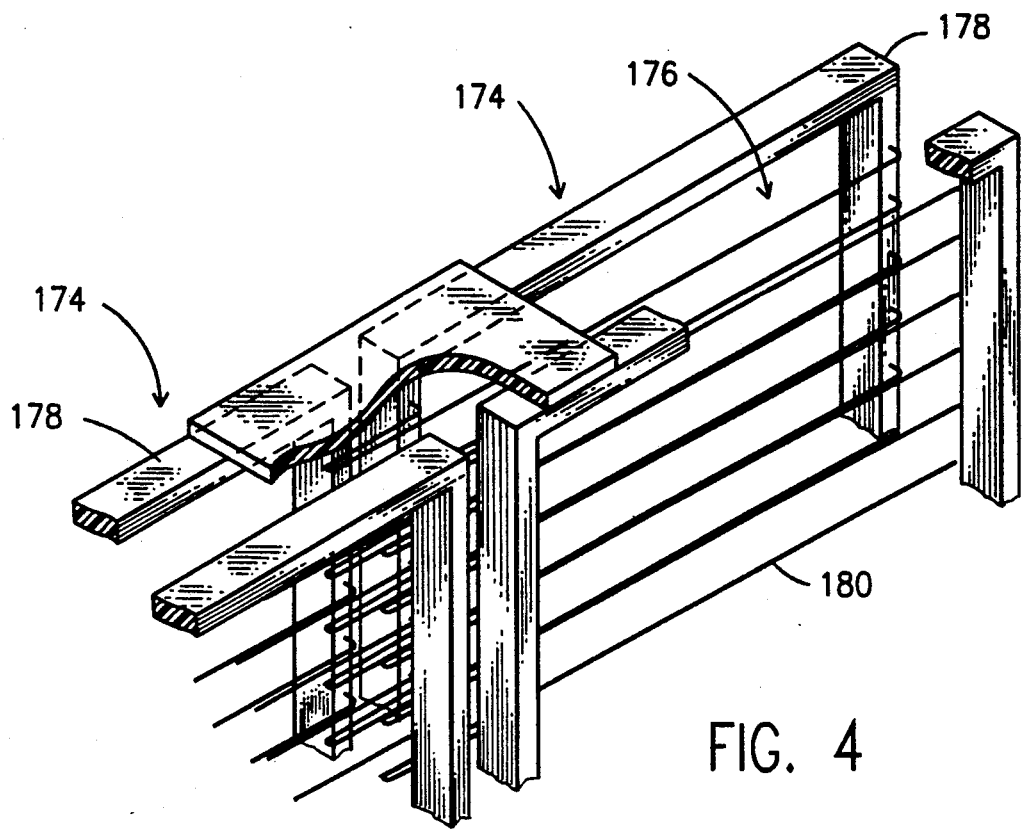
FIG. 4 is a detail isometric view of the article guide means.
Figure 5:
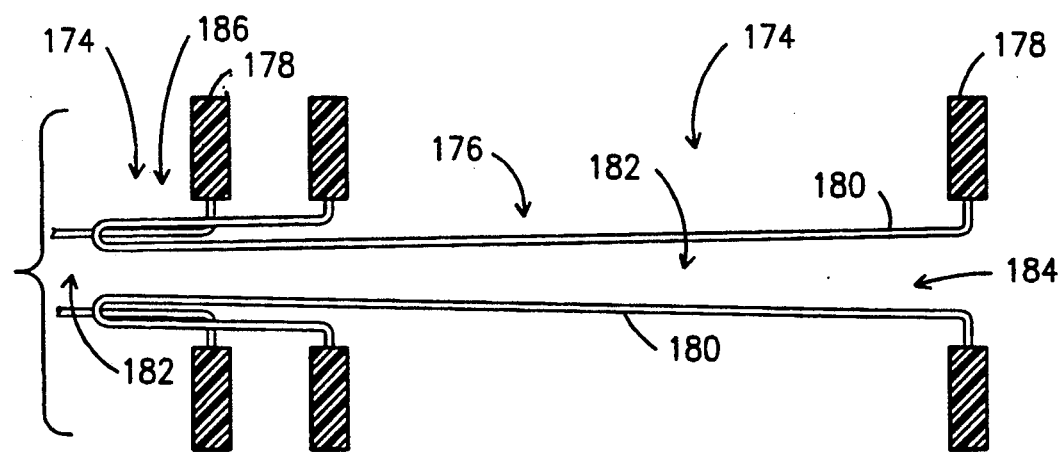
FIG. 5 is a partial top view of the article guide means.

As best shown in FIGS. 2, 4 and 5, the article guide comprises a plurality of article guide sections each generally indicated as 174 disposed in both the processing chamber 22 and rinse chamber 24 on opposite sides of the continuous conveyors 110. Each article guide section 174 comprises a plurality of vertically arranged guide elements each generally indicated as 176 affixed to a guide frame 178. Each guide element 176 comprises a pair of guide members each indicated as 180 disposed in spaced relationship relative to each other to cooperatively form a guide channel 182 therebetween. The guide channel 182 narrows or converges from the proximal to distal end indicated as 184 and 186 respectively and inclined upwardly from the proximal to distal ends 184 and 186. End portions of adjacent article guide sections 174 overlap to provide continuous support of articles A traversing the processing chamber 22.

As previously described the fluid spray tubes 46 and fluid rinse tubes 74 are disposed to form banks of fluid spray tubes 52/58 and banks of fluid rinse tubes 80/86 respectively.

Figure 13:
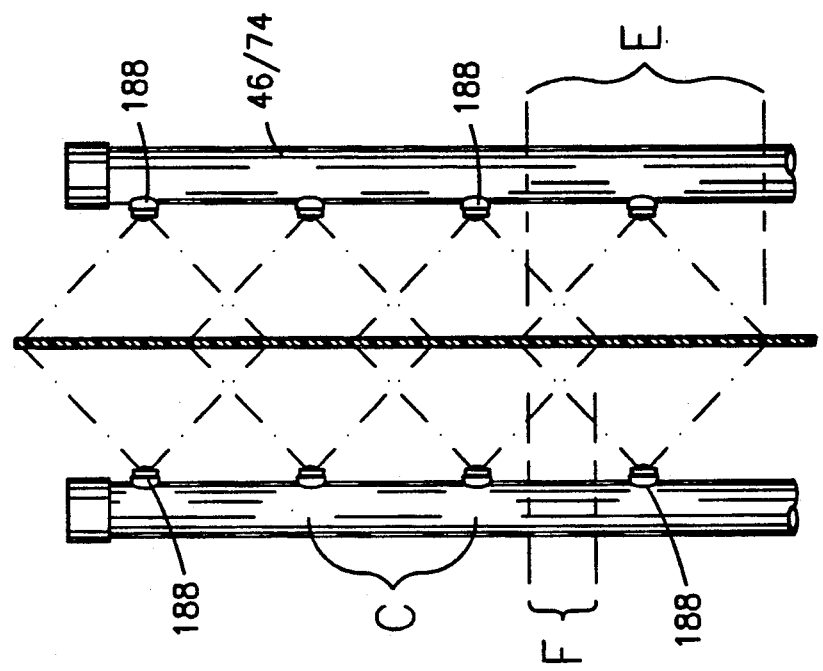
FIG. 13 is a side view of the spray pattern.

These banks 52/58 and 80/86 create a unique spray pattern to provide uniform spray coverage top to bottom and side to side of articles A traversing the processing chamber 22 and rinse chamber 24 as shown in FIG. 13. As shown in FIGS. 6 and 7, an array of spray nozzles each indicated as 188 is formed longitudinally along each fluid spray tube 46 and each fluid rinse tube 74. Fluid slots or orifices 190 formed in each spray nozzle 188 are inclined approximately 7 to 12 degrees from the vertical with a spray coverage B of approximately 80 degrees (FIG. 13). The array of nozzles 188 in adjacent fluid spray tubes 46 and fluid rinse tubes 74 are offset vertically such that the distance C between adjacent nozzles 188 on each fluid spray tube 46 and each fluid rinse tube 74 is substantially three times the vertical offset or distance D between adjacent nozzles 188 of adjacent fluid spray tubes 46 and fluid rinse tubes 74. The vertical dimension E of the liquid from each nozzle 188 striking articles A vertically overlapping the liquid from the next adjacent nozzles 188 disposed on the same fluid spray tubes 46 and fluid rinse tubes 74 shown as F is substantially 40 percent.

In operation, articles A are introduced into the apparatus 10 through the load station 18 that may include a pair of substantially vertical guide panels each indicated as 192 and entry opening 158 of the process module 12 on the conveyor section 104. Articles A are transported through the processing chamber 22 by the corresponding roller seal assemblies 108' and 108" and conveyor section 104 exposing articles A to a processing fluid from the banks 52 and 58 of fluid spray tubes 46. Articles A are then transported through the rinse chamber 24 by the corresponding roller seal assemblies 108', 108" and 108''' and conveyor section 106 exposing articles A to rinse fluid from the banks 80 and 86 of fluid rinse tubes 74. Articles A are finally transported through the drying chamber 26 by the corresponding roller seal assemblies 108', 108" and 108''' exposing articles A to air from the drying tubes 96. Articles A are discharged through the unload station 20 that may include a pair of substantially vertical guide panels each indicated as 194. As can be observed, adjacent roller seal assemblies 108' and 108" transport articles A between the process module 12 and rinse module 14 and between the rinse module 14 and dryer module 16. In addition, since the first and second substantially vertical parallel seal rollers 128 and 130 are normally engaged, the roller seal assemblies 108' and 108" effectively seal the interior of the processing chamber 22, rinsing chamber 24 and drying chamber 26.

Since the roller seal assemblies 108', 108" and 108''', and continuous conveyors 104 and 106 are driven by the drive shaft 162 the entire operation is synchronized.

It will thus be seen that the objects set forth above, among those made apparent from the preceding description are efficiently attained and since certain changes may be made in the above construction without departing from the scope of the invention, it is intended that all matter contained in the above description or shown in the accompanying drawing shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

Now that the invention has been described,

What is claimed is:

1. An apparatus to manufacture or produce articles comprising at least one module including a chamber formed therein having an entry and exit opening formed on opposite ends thereof, a fluid supply means to spray fluid on at least one side of the articles within said chamber, a transport mechanism comprising a continuous conveyor including a plurality of interconnected conveyor links to support the articles thereon, and at least two roller seal assemblies each including a pair of rotatable seal rollers disposed to seal said entry and exit openings respectively and engage the articles passing through said entry and exit openings respectively.

2. The apparatus of claim 1 wherein said article guide comprises at least one article guide section including a plurality of vertically arranged guide elements affixed to a guide frame.

3. The apparatus of claim 1 further including an article guide disposed within said apparatus to maintain the article in a substantially vertical position as the articles traverse said apparatus, said article guide comprises at least one article guide section including a plurality of stationary vertically arrangement guide elements affixed to said apparatus.

4. The apparatus of claim 3 wherein each said guide element comprises a pair of guide members disposed in spaced relationship relative to each other to cooperatively form a guide channel.

5. The apparatus of claim 4 wherein said guide channels narrow or converge from the proximal to the distal end.

6. The apparatus of claim 4 wherein said guide elements are inclined upwardly from the proximal to distal end.

7. The apparatus of claim 3 wherein said articles guide comprises at least two article guide sections, end portions of adjacent article guide sections overlap to provide continuous support of articles within said chamber.

8. The apparatus of claim 1 wherein said continuous conveyor extends between a conveyor drive sprocket rotatably mounted to a frame by a shaft and a conveyor idler sprocket rotatably mounted to said frame by a shaft disposed at the opposite end of said module.

9. The apparatus of claim 8 wherein said roller seal assemblies each comprises a first and second substantially vertical parallel seal roller operatively coupled to a frame by a first and second shaft, each roller seal assembly includes a primary roller drive means comprising a first and second roller drive gear mounted on the upper end portion of said first and second shaft respectively.

10. The apparatus of claim 9 wherein said roller seal assemblies each further includes a roller tension means to normally bias said first and second substantially vertical parallel seal rollers into operative engagement relative to each other.

11. The apparatus of claim 10 wherein said roller tension means comprises an upper and lower roller resilient bias coupled between said first and second substantially vertical parallel seal rollers.

12. The apparatus of claim 10 wherein said first shaft extends through circular apertures formed through an upper and lower frame member of said frame and said second shaft extends through an upper and lower oblong aperture formed through said upper and lower panel members permitting lateral movement of said second substantially vertically parallel seal roller to accommodate passage of articles between said first and second substantially vertical parallel seal rollers.

13. The apparatus of claim 9 wherein said drive means comprises a primary drive shaft coupled to a drive motor, said primary drive shaft operatively coupled to said continuous conveyor by a first conveyor gear affixed to said primary drive shaft and a second conveyor gear affixed to said shaft, said primary drive shaft and a second roller gear affixed to said shaft such that the movement of said continuous conveyor and roller seal assemblies are synchronized.

14. The apparatus of claim 11 wherein said fluid supply means comprises a bank of fluid spray tubes disposed on opposite sides of said chamber.

15. The apparatus of claim 14 wherein each said fluid spray tube of each said bank includes an array of longitudinally arranged nozzles, each said nozzle having a fluid slot formed therein inclined relative to the longitudinal center line of each said fluid spray tube.

16. The apparatus of claim 15 wherein said fluid slots create a spray coverage substantially 80 degrees.

17. The apparatus of claim 16 wherein the distance between adjacent nozzles on each said fluid spray tube is substantially three times the vertical distance between adjacent nozzles on adjacent fluid spray tubes.

18. The apparatus of claim 16 wherein the liquid from each said nozzle on each said fluid spray tube strikes the articles overlaps the liquid from the next adjacent nozzle approximately 40 percent.

19. The apparatus of claim 1 wherein said module comprises a process module and said chamber comprises a processing chamber.

20. The apparatus of claim 19 further including a rinse module having a rinse chamber formed therein disposed in end to end relationship relative to said process module.

21. The apparatus of claim 20 further including a drying module having a drying chamber formed therein disposed in end to end relationship relative to said rinse module.

22. An apparatus to manufacture or produce articles comprising at least one module including a chamber formed therein having an entry and exit opening formed on opposite ends thereof, a fluid supply means to spray fluid on at least one side of the articles within said chamber, a transport mechanism comprising a continuous conveyor including a plurality of interconnected conveyor like to support the articles thereon, and an article guide disposed within said apparatus to maintain the articles in a substantially vertical position as the articles traverse said apparatus, said article guide comprises at least one article guide section including a plurality of stationary vertical arranged guide elements affixed to said apparatus, each said guide element comprises a pair of guide members disposed in spaced relationship relative to each other to cooperatively form a guide channel therebetween to receive the articles as the articles traverse said apparatus, each pair of guide members inclined upwardly from the proximal to distal end thereof.

23. The apparatus of claim 22 wherein said article guide comprises at least two article guide sections wherein end portions of adjacent article guide sections overlap to provide continuous support of the articles.

24. The apparatus of claim 23 wherein each said guide channel narrows from the proximal to the distal end thereof to direct the articles to the next adjacent article guide section.

25. The apparatus of claim 22 wherein said transport mechanism further includes at least two roller seal assemblies each including a pair of rotatable seal rollers disposed to seal the said entry and exit openings respectively and engage the articles passing through said entry and exit openings respectively.

26. The apparatus of claim 25 wherein said continuous conveyor extends between a conveyor drive sprocket rotatably mounted to a frame by a shaft and a conveyor idler sprocket rotatably mounted to said frame by a shaft disposed at the opposite end of said module.

27. The apparatus of claim 26 wherein said roller seal assemblies each comprise a first and second substantially vertical parallel seal roller operatively coupled to a frame by a first and second shaft, each roller seal assembly includes a primary roller drive means comprising a first and second roller drive gear mounted on the upper end portion of said first and second shaft respectively.

28. The apparatus of claim 27 wherein said roller seal assemblies each further include a roller tension means to normally bias said first and second substantially vertical parallel seal rollers into operative engagement relative to each other.

29. The apparatus of claim 28 wherein said roller tension means comprises an upper and lower roller resilient bias coupled between said first and second substantially vertical parallel seal rollers.

30. The apparatus of claim 28 wherein said first shaft extends through circular apertures formed through an upper and lower frame member of said frame and said second shaft extends through an upper and lower oblong aperture formed through said upper and lower panel members permitting lateral movement of said second substantially vertically parallel seal roller to accommodate passage of articles between said first and second substantially vertical parallel seal rollers.

31. The apparatus of claim 27 wherein said drive means comprises a primary drive shaft coupled to a drive motor, said primary drive shaft operatively coupled to said continuous conveyor by a first conveyor gear affixed to said primary drive shaft and a second conveyor gear affixed to said shaft, said primary drive shaft and a second roller gear affixed to said shaft such that the movement of said continuous conveyor and roller seal assemblies are synchronized.

32. The apparatus of claim 22 wherein said fluid supply means comprises a bank of fluid spray tubes disposed on opposite sides of said chamber.

33. The apparatus of claim 32 wherein each said fluid spray tube of each said blank includes an array of longitudinally arranged nozzles, each said nozzle having a fluid slot formed therein inclined relative to the longitudinal center line of each said fluid spray tube.

34. The apparatus of claim 33 wherein said fluid slots create a spray coverage substantially 80 degrees.

35. The apparatus of claim 34 wherein the distance between adjacent nozzles on each said fluid spray tube is substantially three times the vertical distance between adjacent nozzles on adjacent fluid spray tubes.

36. The apparatus of claim 34 wherein the liquid from each said nozzle on each said fluid spray tube strikes the articles overlaps the liquid from the next adjacent nozzle approximately 40 percent.

37. The apparatus of claim 22 wherein said module comprises a process module and said chamber comprises a processing chamber.

38. The apparatus of claim 37 further including a rinse module having a rinse chamber formed therein disposed in end to end relationship relative to said process module.

39. The apparatus of claim 38 further including a drying module having a drying chamber formed therein disposed in end to end relationship relative to said rinse module.

* * * * *